(12) United States Patent
Mori

(10) Patent No.: US 6,780,760 B2
(45) Date of Patent: Aug. 24, 2004

(54) METHODS FOR MANUFACTURING SEMICONDUCTOR DEVICES

(75) Inventor: Katsumi Mori, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 25 days.

(21) Appl. No.: 10/176,069

(22) Filed: Jun. 21, 2002

(65) Prior Publication Data

US 2003/0022485 A1 Jan. 30, 2003

(30) Foreign Application Priority Data

Jun. 21, 2001 (JP) ........................................ 2001-188174

(51) Int. Cl.$^7$ .......................................... H01L 21/4763
(52) U.S. Cl. ...................................................... 438/637
(58) Field of Search ................................. 438/618, 637

(56) References Cited

U.S. PATENT DOCUMENTS 6,294,436 B1 * 9/2001 Park et al. ................... 438/396
6,380,079 B1 * 4/2002 Lee ............................. 438/675

FOREIGN PATENT DOCUMENTS

| JP | 09-172017   | 6/1997 |
| JP | 2001-035921 | 2/2001 |
| JP | 2001-110896 | 4/2001 |

OTHER PUBLICATIONS

Notice of Reasons of Rejection for Japanese Patent Application No. 2001-188174, dated Aug. 19, 2003, which lists JP2001-110896, JP-2001-035921 and JP-09-172017.

* cited by examiner

*Primary Examiner*—David Nelms
*Assistant Examiner*—Thao P. Le
(74) *Attorney, Agent, or Firm*—Konrad Raynes & Victor LLP; Alan S. Raynes

(57) ABSTRACT

A method for manufacturing a semiconductor device that maintains good embedding property of plug metal, and expands the short margin of upper wiring layers to be connected to plugs, may include enlarging an end region 18 of a hole 12, such that embedding of a barrier metal 13 and a plug metal 14 in the hole 12 that is given a high aspect ratio is facilitated. Next, a planarization step is conducted against deposited surfaces of the plug metal 14 by a chemical mechanical polishing (CMP) process. In this step, a part of the interlayer dielectric layer 11 is removed together with an unnecessary portion of the plug metal 14 to a level where the end region (having a diameter d2) that is greater than a practical diameter d1 of the hole 12 disappears. Then, an upper wiring layer 15 is patterned, using a lithography technique, on the planarized interlayer dielectric layer 11 having an exposed portion of the plug metal 14 that has the practical diameter of the hole.

14 Claims, 3 Drawing Sheets

METHODS FOR MANUFACTURING SEMICONDUCTOR DEVICES

Applicant hereby incorporates by reference Japanese Application No. 2001-188174 (P), filed Jun. 21, 2001, in its entirety.

1. Technical Field

The present invention relates to the manufacture of LSIs, and more particularly relates to methods for manufacturing semiconductor devices, including highly integrated semiconductor devices with an improved embedded wiring and metal plugging technology.

2. Related Art

As the progress is being made for even higher integration of LSIs, and further miniaturization of LSI chips, the structure of multiple wiring layers is further miniaturized, and the embedded wiring technology is becoming more important. In particular, as the aspect ratio of a connection hole (contact hole or via hole) becomes greater, an embedded wiring, which is represented by a W (tungsten) plug, becomes more difficult to be embedded within a gap.

FIGS. 3(a)–(d) show cross sections of portions of a method for forming an embedded wiring with a common W plug. As shown in FIG. 3(a), a hole 32 that connects to a lower conductive region 40 (a diffusion layer or a lower wiring layer) is formed in an interlayer dielectric layer 31, using a lithography technique.

Next, as shown in FIG. 3(b), a step of enlarging an opening area of the hole 32 is conducted. In this step, an inverse sputter step is conducted, using Ar plasma, to physically etch an opening edge section of the hole by the ion impact. Enlarging the opening area of the hole 32 makes it easier to embed W in the hole having a high aspect ratio. Also, the surface of the lower conductive region 40 is cleaned by the ion impact, such that a contact resistance between the W and the conduction region is lowered.

Next, as shown in FIG. 3(c), a barrier metal 33 is vapor deposited on the interior of the hole 32 by a sputter method. The barrier metal 33 is vapor deposited by a sputter method in a manner to cover at least a bottom section of the hole. Next, W is deposited to embed the hole 32. Then, the W is etched back by using a plasma etching technique to complete a W plug 34 in the hole 34.

Next, as shown in FIG. 3(d), an upper wiring layer 35 (351, 352) is patterned by using a lithography technique. The wiring layer 352, which is located adjacent to the wiring layer 351, is to be connected to another W plug (not shown).

BRIEF DESCRIPTION OF THE DRAWINGS

Certain embodiments of the invention are described with reference to the accompanying drawings which, for illustrative purposes, are schematic and not necessarily drawn to scale.

SUMMARY

Embodiments include a method for manufacturing a semiconductor device having a contact plug that electrically connects different conductive regions at specified locations that are formed with an interlayer dielectric layer being interposed therebetween over a semiconductor substrate, the method for manufacturing a semiconductor device including forming a hole in the interlayer dielectric layer at a specified location that covers a lower conductive layer region that is one of the different conductive regions, the hole reaching the lower conductive layer region. The method also includes enlarging an upper end region of the hole greater than a practical hole diameter, embedding the hole with a plug metal, and removing a part of the interlayer dielectric layer together with an unnecessary portion of the plug metal to a level where the upper end region that is greater than the practical hole diameter disappears. The method also includes forming an upper conductive layer region that is another of the different conductive regions to be connected to the plug metal.

Embodiments also include a method for manufacturing a semiconductor device having a conducting plug that electrically connects first and second conductive regions separated by an interlayer dielectric layer, including forming a hole extending through the interlayer dielectric layer to expose a surface of the first conductive region. The method also includes forming an end region of the hole defined at least in part by tapered sidewalls that get closer together as the hole extends a distance into the interlayer dielectric layer, the end region being spaced apart from the exposed surface of the first conductive region. A metal layer is deposited into the hole. A depth of the interlayer dielectric layer that defines the end region of the hole is removed. A second conductive region that is electrically connected to the plug metal is formed, wherein the plug metal is positioned between the first and second conductive regions.

Embodiments also include a method for forming a semiconductor device, including forming a first conductive layer on a semiconductor substrate, forming an interlayer dielectric layer on the first conductive layer, and forming a via extending through the interlayer dielectric layer and contacting the first conductive layer. The method also includes forming a first depth of the via to have a width that is greater than that of the via under the first depth. The method also includes filling the via with a conducting material and a barrier layer between the conducting material and the first conductive layer. The method also includes removing a portion of the conducting material and the interlayer dielectric layer so that the first depth of the via is eliminated, and forming a second conductive layer on the metal layer, wherein the conducting material is positioned between the first and second conductive layers.

DETAILED DESCRIPTION

Figure 3:
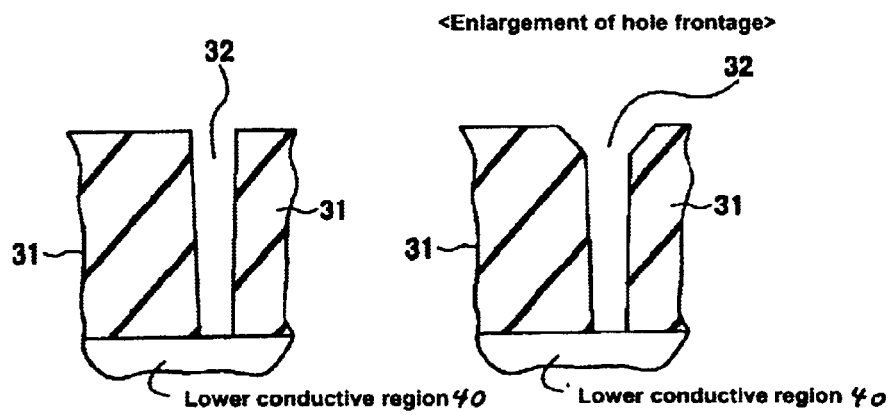
FIGS. 3(a)–(d) show cross sections of portions of a method for forming an embedded wiring with a common W plug.
Figure 3:
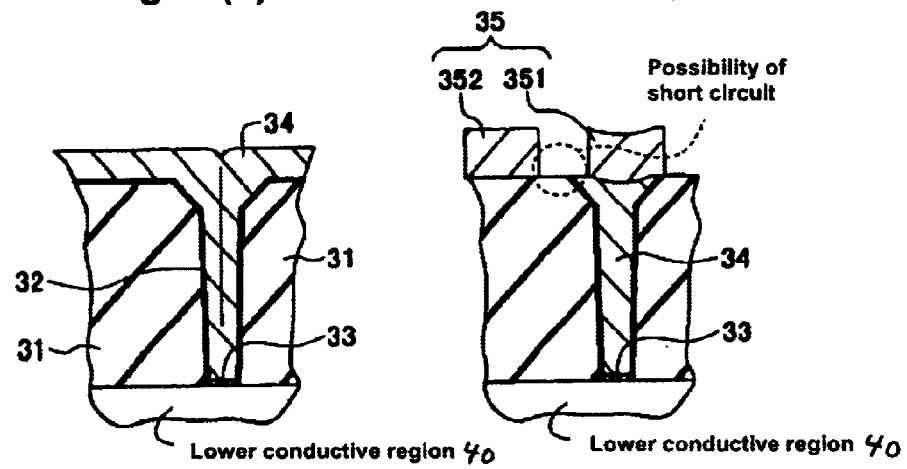

As shown in FIG. 3(c), the deposit of W at the hole 32 becomes thicker at the upper edge section of the hole at a rate faster than that of the bottom section thereof. For this reason, the step of enlarging the opening area of the hole 32 indicated in FIG. 3(b) is conducted such that the W completely fills the hole 32. This provides a countermeasure to inhibit the generation of voids (cavities).

However, the step of enlarging the opening area of the hole 32 indicated in FIG. 3(b) is equal to apparently enlarging the diameter of a portion of the hole. Accordingly, the plug diameter, which is exposed after etching back, is greater than the actual diameter of the hole below the enlarged opening area.

Due to the miniaturization and higher integration, matching margins of the upper wiring layer 35 (351, 352) with respect to the plug metal (W plug 34) are extremely small. If there is a section with a narrow pitch such as a section between the adjacent wiring layers 351 and 352, there is a possibility of short circuits. In other words, when the upper wiring layer 35 is formed, if there is a large enough deviation in pattern matching in the lithography step, the probability of short circuits may become very high.

In order to further advance the miniaturization, the step of enlarging the opening area of the hole is used for embedding plug metal. Also, the inverse sputter step is used in order to lower the resistance at the connection section with plug metal at the bottom section of the hole. However, the short margin in the upper wiring layer that connects to the plugs is further narrowed, and in effect, a problem may occur that the wiring layer (such as 35) is prevented from being further narrowed.

Certain embodiments of the present invention are made in view of the circumstances described above, and provide methods for manufacturing a semiconductor device, which maintain good embedding property of plug metal, expands short margins of upper wiring layers that connect to plugs, and accommodates further miniaturization.

One method for manufacturing a semiconductor device in accordance with an embodiment of the present invention relates to a method for manufacturing a semiconductor device having a contact plug that electrically connects different conductive regions at specified locations that are formed with an interlayer dielectric layer being interposed therebetween over a semiconductor substrate, and the method for manufacturing a semiconductor device is characterized in comprising the steps of: forming a hole in the interlayer dielectric layer at a specified location that covers a lower conductive layer region that is one of the different conductive regions, the hole reaching the lower conductive layer region; enlarging a upper end region of the hole greater than a practical hole diameter; embedding the hole with a plug metal; removing a part of the interlayer dielectric layer together with an unnecessary portion of the plug metal to a level where the upper end region that is greater than the hole diameter disappears; and forming an upper conductive layer region that is another of the different conductive regions to be connected to the plug metal.

By the method described above for manufacturing a semiconductor device in accordance with certain embodiments of the present invention, the hole is provided with an upper end region that is greater than a practical diameter of the hole to facilitate embedding of plug metal, and then the upper end region that is greater than the diameter of the hole is removed. As a result, the short margin may be enlarged in the formation of upper conductive regions.

Also, in certain embodiments, the step of embedding the hole with the plug metal may include a step of covering an interior of the hole with a barrier metal. In other words, when the plug metal and the conductive region to be connected have a mutual relation to form another phase by diffusion or reaction, this is prevented by the barrier metal, and an increase in the resistance is may be prevented.

Also, in certain embodiments, it is characterized in that the step of enlarging an end region of the hole greater than a practical hole diameter is achieved by a sputter etching step. In other words, the edge section defining the end region of the hole is physically cut and rounded. This is generally easier to control than chemical etching.

Also, in view of the above, more preferably, in certain embodiments, it is characterized in that the step of embedding the hole with a plug metal is conducted on the premise that a barrier layer is included in the plug metal and a sputter step of covering an interior of the hole with a barrier metal is conducted, and the step of enlarging an end region of the hole greater than a practical hole diameter is achieved by an inverse sputter step conducted in a sputter chamber used for the sputter step. This further rationalizes the process steps.

Furthermore, in certain embodiments, as a part of the rationalization of the process steps, a part of the interlayer dielectric layer is removed together with an unnecessary portion of the plug metal (in other words, the W at the upper end region that is greater than the practical diameter of the hole). This process may be successively conducted by a planarization step by chemical mechanical polishing, while changing the slurry being supplied.

FIGS. 1(a)–(d) relate to a method for manufacturing a semiconductor device in accordance with one embodiment of the present invention, and show cross sections of portions in process order of a method of forming embedded wirings with W plugs using W as a plug metal.

Figure 1:
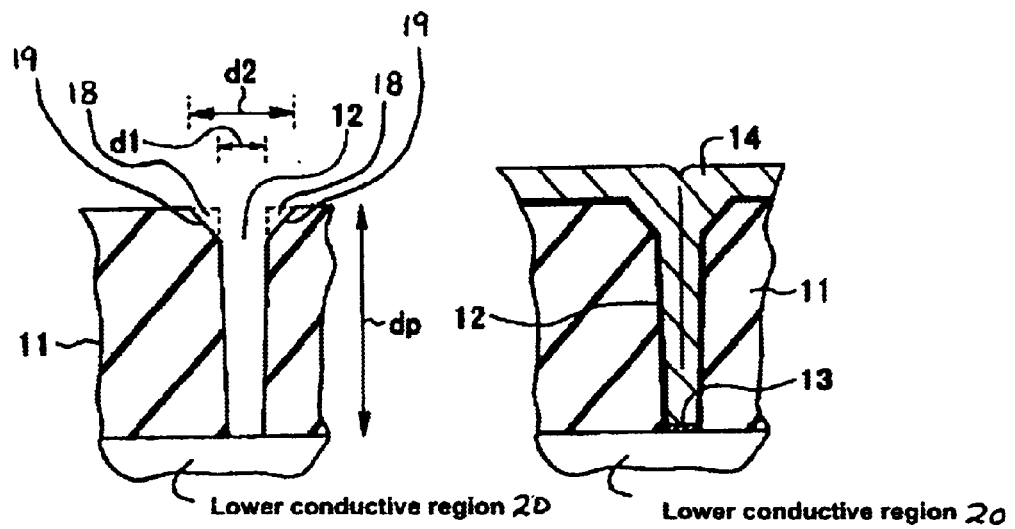
FIGS. 1(a)–(d) relate to a method for manufacturing a semiconductor device in accordance with an embodiment of the present invention, and show cross sections of aspects in process order of a method of forming embedded wirings with W (tungsten) plugs using W as plug metal.
Figure 1:
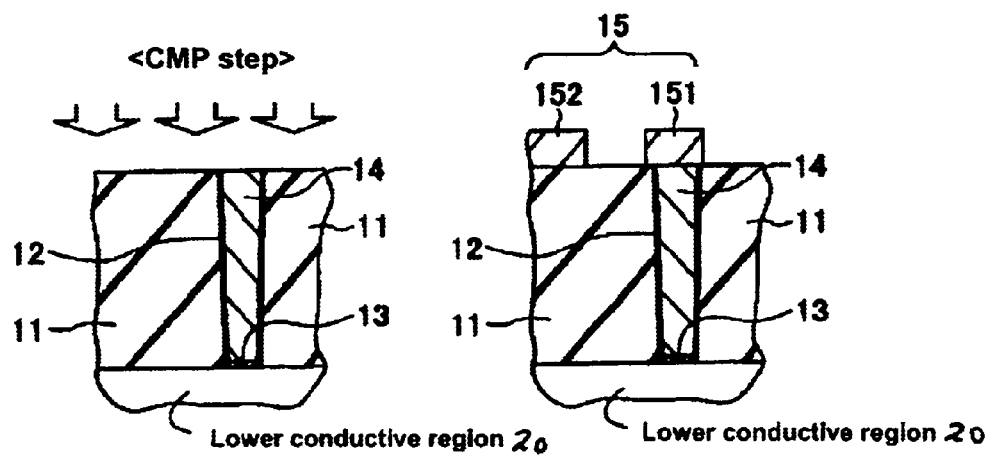

As shown in FIG. 1(a), a hole 12 that connects to a lower conductive region 20 (for example, a diffusion layer in the substrate or a lower wiring layer) is selectively formed in an interlayer dielectric layer 11, using a lithography technique (an upper end region 18 of the hole 12 is indicated in part by broken lines at the upper end of the hole 12 in FIG. 1 (a)). As illustrated in FIGS. 1(a)–1(b), the upper end region 18 of the hole 12 includes a width is larger than that of the rest of the hole 12. The hole 12 generally has a high aspect ratio, which is close to five. It is noted that the hole 12 may in certain embodiments have a diameter d1 that is, for example, about 0.2–about 0.35 $\mu$m, and a depth dp that is, for example, about 0.9 $\mu$m.

Next, a step of enlarging the upper end region 18 of the hole 12 is conducted. This step may in certain embodiments preferably be conducted by an inverse sputter process that uses Ar plasma to physically etch an opening edge section of the hole by ion impact. The width of the upper end region 18 of the hole 12 is defined by a line 19 in FIG. 1(a), in which its upper diameter d2 is enlarged by more than 1.5 times greater than the practical diameter d1 of the hole. This facilitates embedding of W in the hole 12 with a high aspect ratio. Also, the surface of the lower conductive region 20 is cleaned by the ion impact, which plays a role to lower the contact resistance between the W to be embedded in the hole 12 and the conductive region 20.

Then, as shown in FIG. 1(b), a barrier layer 13 may be vapor deposited on the interior of the hole 12 by a sputter method. The barrier layer 13 is preferably vapor deposited by a sputter method to cover at least a bottom section of the hole. As a result of enlarging the upper end region 18 of the hole 12, the coverage of the barrier layer 13 improves.

When a W plug is embedded, a Ti/TiN film is useful as the barrier layer 13, which may be successively formed by sputtering in, for example, the same sputtering apparatus used for sputter etching the upper end region defining of the hole 12. A TiN film may be formed by sputtering Ti in a nitrogen atmosphere. Next, a plug metal 14 comprising W may be deposited and embedded in the hole 12 by a thermal CVD method.

Next, as shown in FIG. 1(c), the deposited surface of the plug metal 14 is planarized, preferably using a chemical mechanical polish, in other words, is subject to planarization by a CMP (chemical mechanical polishing) step. The CMP step is generally initially conducted while supplying slurry that promotes polishing and cutting the W. Preferably, after a final detection of exposure of the barrier layer 13 (represented by a change in the torque or a change in the surface reflective index), unnecessary portions of the barrier layer 13 are removed by a CMP step with slurry that can provide a specified selectivity with respect to the interlayer dielectric layer 11. After a final detection of exposure of the interlayer dielectric layer 11, a CMP step is preferably conducted in succession with slurry that includes a large amount of polishing grains such as silica grains.

The CMP step using a large amount of silica grains is mainly aimed at physical polishing. By this, a part of the interlayer dielectric layer 11 is removed together with unnecessary portions of the plug metal 14 to a level where the upper end region 18 is greater than the diameter of the hole 12 (>d1) disappears. This CMP step is controlled by a passage of time, for example.

Next, as shown in FIG. 1(d), an upper wiring layer 15 (151, 152) is patterned using a lithography technique on the planarized interlayer dielectric layer 11 that includes an exposed portion of the plug metal 14 having the practical hole diameter. The adjacent wiring layer 152 may be connected to another plug metal not shown in the figure, which may have a variety of structures including a plug structure similar to plug metal 14.

The method in accordance with the embodiment described above facilitates embedding of the plug metal (W plug) by providing a end region that is greater than the practical hole diameter d1. Then, the end region greater than the hole diameter d1 is removed. By this, the short margin can be expanded when the upper wiring layer 15, including regions 151, 152 are formed.

A photoresist may be readily, accurately patterned on the interlayer dielectric layer 11 that is planarized by a CMP method. Further, the exposed portion of the plug metal 14 having the practical hole diameter d1 would have a measurement that is generally equal to the designed measurement. This high precision presents one of the factors that will permit further miniaturization in the future.

Also, in forming the plug metal 14 in the hole 12, since the plug metal and the lower layer in different metals may often be connected, as indicated in FIG. 1(b), a barrier layer may become necessary. The step of forming a W plug in this embodiment is conducted on the premise that a step of coating a barrier layer (for example, a Ti/TiN deposited layer) on the interior of the hole is conducted.

In other words, when the plug metal 14 and the conductive region 20 in the lower layer to be connected (such as a wiring layer or a substrate) may have a mutual relation to form another phase by diffusion or reaction, this may be prevented by the barrier layer 13, and an increase in the resistance may be prevented. If there is not such a possibility to form an undesirable phase or reaction between the plug metal 14 and the underlying conductive region 20, a barrier layer is not necessary. If, for example, the upper wiring layer 15 (151, 152) contains aluminum as a main composition, the wiring layer 15 may often need a barrier layer.

Also, the step of enlarging a upper end region 18 of the hole 12 greater than the practical hole diameter d1 shown in FIG. 1(a) may preferably be achieved by a sputter etching step. The process of physically cutting and rounding the hole edge section is generally easier to control than when using the chemical etching.

In view of the above, as a more preferable manufacturing flow, the step of enlarging the end region 18 of the hole 12 greater than the practical hole diameter d1 may preferably be achieved by an inverse sputter step conducted in the same sputter chamber that is used for the sputter step for coating the barrier layer 13. This further rationalizes the process steps.

Figure 2:
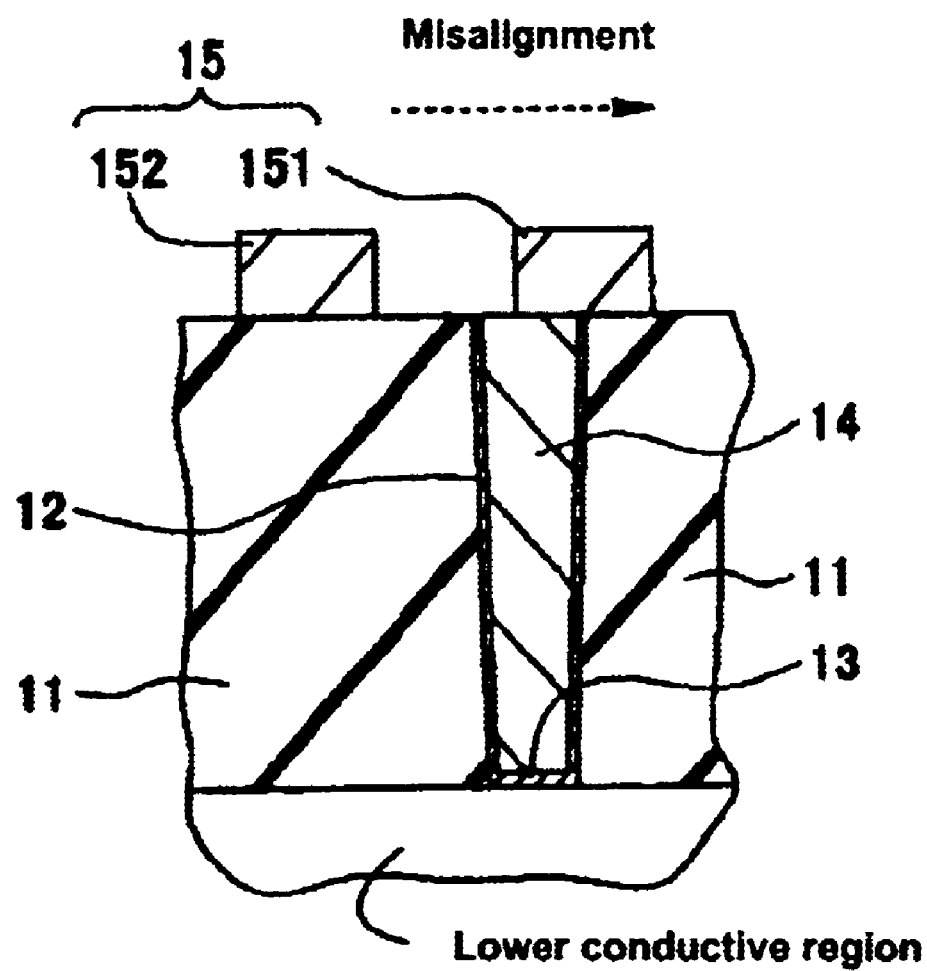
FIG. 2 shows a cross-sectional view illustrating that an upper wiring layer formed is misaligned with respect to a plug metal formed by the method in accordance with an embodiment of the present invention in which the plug metal has a structure such as the one shown in FIG. 1(d).

FIG. 2 shows a cross-sectional view illustrating that the upper wiring layer formed is misaligned (misalignment in the photolithography) with respect to the plug metal formed by the method in accordance with the above-described embodiment, which corresponds to the plug metal shown in FIG. 1(d). In other words, because the step indicated in FIG. 1(c) is conducted, the diameter (d1) of the hole becomes to be generally equal to the designed measurement. Accordingly, short circuits with the plug metal 12 at a location where the pitch of the upper layers is narrow may be prevented with a higher probability compared to a conventional structure. As seen in FIG. 2, the wiring regions 151 and 152 are misaligned so that a relatively large portion of the plug metal 14 is uncovered by the wiring region 151. The misalignment also causes wiring region 152 to be positioned closer to the plug metal 14. If the upper portion of the plug was wider than the other portions of the plug, then the wiring region 152 might be close enough for a short circuit to occur between the wiring region 152 and the plug. However, as illustrated in FIG. 2, the upper portion of the plug metal does not have a greater width than the rest of the plug and thus the risk of a short circuit due to a close distance between the plug and the wiring region is minimized.

It is noted that the method of the present invention described above is not limited to W plugs, but also applicable in forming plugs with other metal. For example, it can be used for forming copper (Cu) plugs. Since there is a possibility that Cu may diffuse in the $SiO_2$ film of the interlayer dielectric layer, a barrier material such as WN or TaN may be coated on the interior of the hole as a barrier layer. In particular, since it is desirable for the sidewall sections of the hole to be covered, attention should be given to the sputter condition. Cu plugs may be formed by, for example, thermal CVD, electrolytic plating, or electroless plating.

Even when the Cu plug is formed, a step of enlarging the end region of the hole, like the step indicated in FIG. 1, may be employed to shape a hole configuration that helps the growth of the barrier metal and Cu.

Then, after the plug metal (14) is formed by embedding the barrier metal and Cu in the hole (12), like the one shown in FIG. 1(b), a CMP may be conducted while supplying slurry that promotes polishing and cutting the Cu. After a final detection of exposure of the barrier metal, unnecessary portions of the barrier layer are removed by a CMP step with slurry that can provide a specified selectivity with respect to the interlayer dielectric layer (11). After a final detection of exposure of the interlayer dielectric layer 11, a CMP step is conducted in succession with slurry that includes a lot of polishing grains such as silica grains (see FIG. 1(c)).

By this, a part of the interlayer dielectric layer (11) is removed together with unnecessary portions of the Cu plug metal (14) to a level where the upper end region greater than the diameter of the hole (12) (>d1) disappears. This CMP step is controlled by a passage of time, for example. As a result, the short margin can be enlarged in the formation of the upper wiring layer 15 (151, 152), like the one shown in FIG. 3(d), which contributes to further miniaturization.

By the method in accordance with preferred embodiments of the present invention, a part of the interlayer dielectric layer 11 is removed, such that the depth of the interlayer dielectric layer and the hole 12 may become substantially small compared to those provided by the conventional technology. If the reduction in thickness causes problems in designing the circuit, the interlayer dielectric layer 11 can be formed thicker by an amount of the portion to be cut, and it is not difficult to design the circuit in consideration of the above.

As described above, a end region greater than a practical diameter of a hole is provided to facilitate embedding of plug metal in the hole, and then a planarization step is conducted while the frontage region greater than the diameter of the hole is removed. As a result, certain embodiments of the present invention may provide a method for manufacturing a semiconductor device that maintains good embedding property of the plug metal, expands the short margin of upper wiring layers to be connected to the plug, and is capable of accommodating further device miniaturization.

In addition, it will be understood that a variety of modifications may be made to the embodiments described above within the scope of the present invention.

What is claimed:

1. A method for manufacturing a semiconductor device having a contact plug that electrically connects different conductive regions at specified locations that are formed with an interlayer dielectric layer being interposed therebetween over a semiconductor substrate, the method for manufacturing a semiconductor device comprising:

forming a hole in the interlayer dielectric layer at a specified location that covers a lower conductive layer region that is one of the different conductive regions, the hole reaching the lower conductive layer region;

enlarging an upper end region of the hole greater than a practical hole diameter;

embedding the hole with a plug metal;

removing a part of the interlayer dielectric layer together with an unnecessary portion of the plug metal to a level where the upper end region that is greater than the practical hole diameter disappears; and forming an upper conductive layer region that is another of the different conductive regions to be connected to the plug metal.

2. A method for manufacturing a semiconductor device according to claim 1, wherein the embedding the hole with the plug metal includes covering an interior of the hole with a barrier layer.

3. A method for manufacturing a semiconductor device according to claim 1, wherein the enlarging an upper end region of the hole greater than a practical hole diameter is achieved by a sputter etching step.

4. A method for manufacturing a semiconductor device according to claim 1, wherein the embedding the hole with a plug metal includes covering an interior of the hole with a barrier metal formed by sputtering in a sputtering chamber, and the enlarging an upper end region of the hole greater than a practical hole diameter is achieved by performing an inverse sputtering step conducted in the sputter chamber.

5. A method for manufacturing a semiconductor device according to any one of claim 1, wherein the removing a part of the interlayer dielectric layer together with an unnecessary portion of the plug metal is achieved by planarization conducted by chemical mechanical polishing.

6. A method as in claim 4, wherein the inverse sputtering step includes sputtering an ion that collides with the interlayer dielectric layer and dislodges a portion of the interlayer dielectric layer to enlarge the frontage region of the hole.

7. A method for manufacturing a semiconductor device having a conducting plug that electrically connects first and second conductive regions separated by an interlayer dielectric layer, comprising:

forming a hole extending through the interlayer dielectric layer to expose a surface of the first conductive region;

forming an end region of the hole defined at least in part by tapered sidewalls that get closer together as the hole extends a distance into the interlayer dielectric layer, the end region being spaced apart from the exposed surface of the first conductive region;

depositing a metal layer into the hole;

removing a depth of the interlayer dielectric layer that defines the end region of the hole; and forming a second conductive region electrically connected to the plug metal, wherein the plug metal is positioned between the first and second conductive regions.

8. A method as in claim 7, wherein the tapered sidewalls are formed using a sputter etching operation.

9. A method as in claim 7, wherein a barrier layer is deposited into the hole prior to depositing the metal layer into the hole.

10. A method as in claim 9, wherein the barrier layer is positioned between the metal layer and the first conductive layer.

11. A method as in claim 9, wherein the metal layer includes tungsten and the barrier layer includes at least one of titanium and titanium nitride.

12. A method as in claim 9, wherein the metal layer includes Cu and the barrier layer includes at least one of tungsten nitride and tantalum nitride.

13. A method as in claim 9, wherein the barrier layer is formed by a sputter deposition process in a sputtering chamber, and the removing a depth of the interlayer dielectric layer is carried out by an sputter etch process in the chamber.

14. A method for forming a semiconductor device, comprising:

forming a first conductive layer on a semiconductor substrate, forming an interlayer dielectric layer on the first conductive layer forming a via extending through the interlayer dielectric layer and contacting the first conductive layer;

forming a first depth of the via to have a width that is greater than that of the via under the first depth;

filling the via with a conducting material and a barrier layer between the conducting material and the first conductive layer;

removing a portion of the conducting material and the interlayer dielectric layer so that the first depth of the via is eliminated; and forming a second conductive layer on the conducting material, wherein the conducting material is positioned between the first and second conductive layers.

* * * * *